United States Patent [19]
Cho et al.

[11] Patent Number: 5,512,518
[45] Date of Patent: Apr. 30, 1996

[54] METHOD OF MANUFACTURE OF MULTILAYER DIELECTRIC ON A III-V SUBSTRATE

[75] Inventors: Jaeshin Cho, Gilbert; Kelly W. Kyler, Chandler; Wayne A. Cronin, Tempe; Mark Durlam, Chandler; Jonathan K. Abrokwah, Tempe, all of Ariz.

[73] Assignee: Motorola, Inc., Schaumburg, Ill.

[21] Appl. No.: 254,209

[22] Filed: Jun. 6, 1994

[51] Int. Cl.$^6$ .................................................. H01L 21/265
[52] U.S. Cl. ........................ 437/235; 437/238; 437/241; 437/978
[58] Field of Search .................................... 437/235, 238, 437/241, 978, 61, 62

[56] References Cited

U.S. PATENT DOCUMENTS

| | | | |
|---|---|---|---|
| 3,798,752 | 3/1974 | Fujimoto | 437/978 |
| 3,903,591 | 9/1975 | Wenzig et al. | 437/978 |
| 3,925,572 | 12/1975 | Naber | 437/978 |
| 3,978,577 | 9/1976 | Bhattacharyya et al. | 437/978 |
| 4,789,648 | 12/1988 | Chow et al. | 437/225 |
| 4,944,836 | 7/1990 | Beyer et al. | 156/645.1 |
| 4,980,307 | 12/1990 | Ito et al. | 437/235 |

FOREIGN PATENT DOCUMENTS

| | | |
|---|---|---|
| 60-136267 | 7/1985 | Japan . |
| 62-272571 | 11/1987 | Japan . |
| 62-276832 | 12/1987 | Japan . |
| 1-244666 | 9/1989 | Japan . |

OTHER PUBLICATIONS

S. Subbanna et al., "A Novel Borderless Contact/Interconnect Technology Using Aluminum Oxide Etch Stop for High Performance SRAM and Logic", IEEE, 1993, pp. 441–444.

R. D. J. Verhaar et al., "A 2.5 μm 2 Bulk Full CMOS SRAM Cell Technology with Fully Overlapping Contacts", IEEE, 1990, pp. 473–476.

*Primary Examiner*—R. Bruce Breneman
*Attorney, Agent, or Firm*—Miriam Jackson

[57] ABSTRACT

A manufacturable III–V semiconductor structure having small geometries is fabricated. A silicon nitride layer is formed on a III–V semiconductor material and a dielectric layer comprised of aluminum is formed on the silicon nitride layer. Another dielectric layer comprised of silicon and oxygen is formed over the dielectric layer comprised of aluminum. The dielectric layer comprised of aluminum acts as an etch stop for the etching of the dielectric layer comprised of silicon and oxygen with a high power reactive ion etch. The dielectric layer comprised of aluminum may then be etched with a wet etchant which does not substantially etch the silicon nitride layer. Damage to the surface of the semiconductor material by exposure to the high power reactive ion etch is prevented by forming the dielectric layer comprised of aluminum between the silicon nitride layer and the dielectric layer comprised of silicon and oxygen.

13 Claims, 2 Drawing Sheets

METHOD OF MANUFACTURE OF MULTILAYER DIELECTRIC ON A III-V SUBSTRATE

BACKGROUND OF THE INVENTION

This invention relates, in general, to a semiconductor device, and more particularly, but not limited to, a gallium arsenide semiconductor device and method of manufacture using an insulating layer comprised of aluminum.

A silicon nitride layer and a silicon dioxide layer overlying the silicon nitride layer are typically used to protect the surface of a gallium arsenide semiconductor material. A high power reactive ion etch is used to remove portions of the silicon dioxide layer. As device geometries have shrunk, it has been difficult to maintain a uniform etch of the silicon dioxide layer across a wafer without etching of the underlying silicon nitride layer. This difficulty results in reactive-ion etch induced damage to the gallium arsenide surface. This damage to the gallium arsenide surface results in poor device yield, poor electrical characteristics and performance of the semiconductor device.

Therefore, it would be desirable to have a manufacturable process which allows for the fabrication of gallium arsenide devices free of reactive ion etch induced damage.

DETAILED DESCRIPTION OF THE DRAWINGS

The present invention allows for the formation of the III–V semiconductor device by using a dielectric layer comprised of aluminum as an etch stop layer in order to protect the semiconductor surface from a (high power) reactive ion etch (RIE) of an overlying dielectric layer comprised of silicon and oxygen. Without the use of the dielectric layer comprised of aluminum, the surface of the semiconductor material will be exposed to the high power RIE because of non-uniformities of the etch rate across the wafer. Exposure of the semiconductor material to the high power RIE causes electrically active defects in the semiconductor material. As will be described below, this invention prevents the exposure of the semiconductor material to high power RIE, thus enabling the manufacture of III–V semiconductor devices with small geometries.

Figure 1:
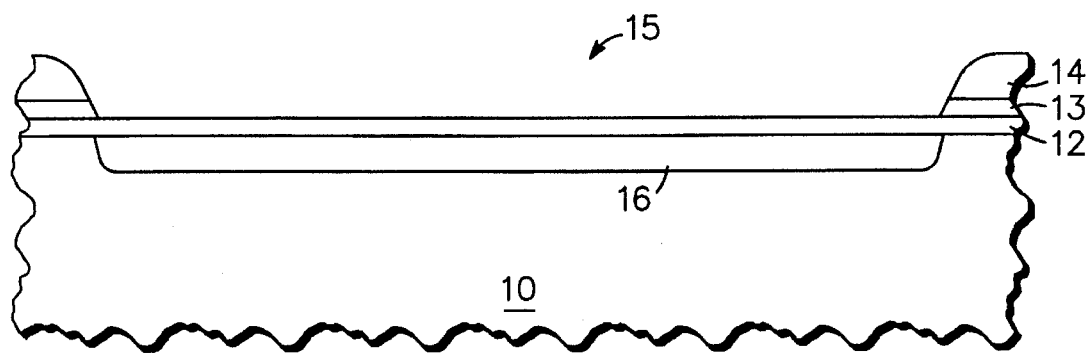
FIG. 1 illustrates an enlarged, cross-sectional view of an embodiment of the present invention in a beginning stage of fabrication.

FIG. 1 illustrates an enlarged, cross-sectional view of an embodiment of the present invention. What is shown is a semiconductor material 10 comprised of a III–V compound. Semiconductor material 10 is preferably comprised of gallium arsenide (GaAs). First, a silicon nitride layer 12 is formed on the surface of semiconductor material 10 to prevent outgassing of semiconductor material 10. Other dielectric layers which prevent outgassing may be used. Silicon nitride 12 can be formed using conventional means known in the art, and preferably has a thickness of approximately 100 to 1000 angstroms in order to protect the surface of the III–V semiconductor material during a subsequent processing.

Next, a dielectric layer 13 comprised of aluminum is formed over silicon nitride layer 12. Dielectric layer 13 can be comprised of, for example, aluminum nitride or aluminum oxide. Preferably, dielectric layer 13 is formed by reactive sputtering of aluminum using argon and nitrogen or oxygen gases. Other processes, such as metal-organic chemical vapor deposition may be used. The thickness of dielectric layer 13 is preferably approximately 100 to 1000 angstroms. The lower limit is constrained by the desire to avoid pin-hole formation associated with thinner layers where dielectric layer 13 would lose its etch stop property, while the upper limit is constrained by the loss of dimensional control due to undercutting of dielectric layer 13. Most preferably, the thickness of dielectric layer 13 ranges from about 300 to 500 angstroms in order to optimize both its etch stop property and ease of etching. Dielectric layer 13 acts as a sacrificial etch stop layer, as will be further described below.

Because dielectric layer 13 caps silicon nitride layer 12, it is necessary to provide silicon nitride layer 12 free of hydrogen and moisture. Otherwise, dielectric layer 13 prevents the release of the hydrogen and moisture, which results in cracking of silicon nitride layer 12.

Subsequently, a dielectric layer 14 comprised of silicon and oxygen is formed over dielectric layer 13. In a preferred embodiment, dielectric layer 14 is comprised of silicon dioxide ($SiO_2$) because it is widely used in semiconductor manufacturing, but a silicon oxynitride ($SiO_xN_y$), for example, may also be used. Dielectric layer 14 may be formed using typical deposition processes, such as plasma enhanced chemical vapor deposition. The thickness of dielectric layer 14 is preferably approximately 1000 to 7000 in order to act as a mask of further ion implantation processes.

A portion of dielectric layer 14 and dielectric layer 13 is then removed to form an opening over an active area 15, the area in semiconductor material 10 where the active portions of the semiconductor device are to be formed.

The method of removing dielectric layer 14 and dielectric layer 13 is an important feature of this invention. First, dielectric layer 14 is removed using a reactive ion etch using a fluorine based plasma. Typical fluorine based plasmas include $C_2F_6$, $SF_6$, $NF_3$, $CF_4$, and $CHF_3$. A fluorocarbon based plasma is preferably used because of the controllability of the slope of the sidewall of the layer to be etched.

It is important to note that the fluorine based plasma does not etch dielectric layer 13 comprised of aluminum. This is important because the surface of semiconductor material 10 can be completely protected from the high power RIE used for etching of dielectric layer 14. In an actual device fabrication, a certain degree of overetch is required to accommodate the etch rate non-uniformity across the wafer, day-to-day fluctuations of the etch rate and the thickness variations of the as-deposited film to be etched. Because dielectric layer 13 in the present invention is an infinite etch stop for fluorine based plasmas, it will buffer all process fluctuations occurring during deposition and etching of dielectric layer 14. Therefore, by using dielectric layer 13 in the process of manufacturing the III–V semiconductor device becomes simpler and more manufacturable with large process latitude such as independence of the type of etch equipment, wafer diameter, and photolithographic mask density.

Dielectric layer 13 comprised is then preferably removed using an ammonium hydroxide solution ($NH_4OH$). Most preferably, the solution has an approximate ratio of $NH_4OH:H_2O$ (1:10) and used at a temperature of approximately 20° to 40° C. Other wet chemistries may be suitable, however, dilute ammonium hydroxide is preferabe because a reproducible etch rate is obtained and it is compatible with gallium arsenide. It is also important to note that the portion of dielectric layer 13 which must be removed for further processing to take place is removed before dielectric layer 13 is exposed to a high temperature (greater than approximately 500° C.) step. It has been discovered that dielectric layer 13 becomes difficult to remove after it has been subjected to a high temperature step. This is contrary to what has been published by others in the past.

It is believed that when dielectric layer 13 is exposed to a fluorine based plasma, a small amount of an aluminum fluoride layer is formed on the surface of dielectric layer 13, and when this aluminum fluoride layer is exposed to a high temperature, a reaction takes place altering the chemistry of the aluminum fluoride layer making it impossible to remove with any known etchants. The present invention utilizes dielectric layer 13 as a sacrificial layer by avoiding the exposure of dielectric layer 13 to a high temperature step before its removal.

FIG. 1 illustrates the structure after a dielectric layer 13 and dielectric layer 14 have been patterned to provide an active area 15 of semiconductor material 10. In addition, a channel region 16 is formed in active area 15 of semiconductor material 10 using well known techniques. Typically, ion implantation of silicon impurities through silicon nitride layer 12 is performed.

Figure 2:
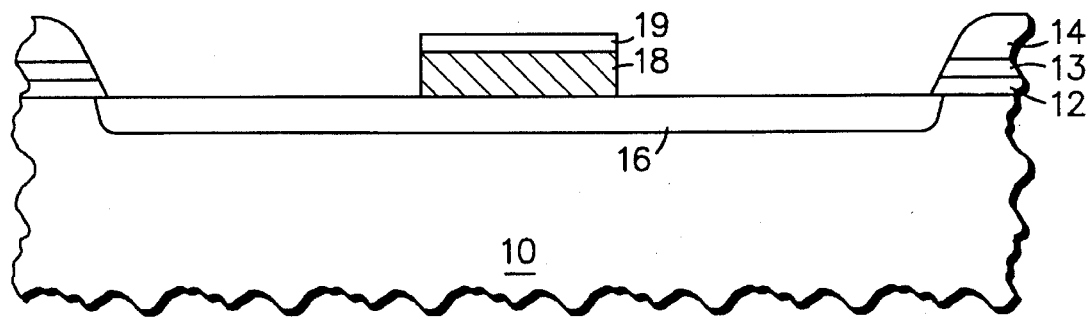
FIG. 2 illustrates the embodiment of the present invention in a further stage of fabrication.

FIG. 2 illustrates the structure of FIG. 1 further along in processing. First, the exposed portion of silicon nitride layer 12 over active area 15 is removed. This removal is accomplished by using a low power fluorine based plasma. A suitable plasma is comprised of $SF_6$ using a power of 100 to 200 watts, although other etchants suitable for use at this low power may be used. It is important to use a lower power plasma so that the surface of semiconductor material 10 in channel region 16 is not damaged. Any damage to the surface would leave or create electrically active defects resulting in deviations from the ideal diode characteristics such as high diode ideality factor and low Schottky barrier height.

After removal of silicon nitride layer 12, a gate layer 18 and a hard masking layer 19 is formed and patterned over a portion of active area 15. Conventional photolithographic and etching techniques are used to form gate layer 18 and hard masking layer 19. Gate layer 18 is preferably comprised of a refractory metal or metals such as titanium-tungsten-nitride, tungsten-silicon, tungsten-nitride, tungsten-silicon-nitride, among others. Hard masking layer 19 is comprised of a material such as an insulating layer such as silicon dioxide. Hard masking layer 19 is optional; the structure may be fabricated without hard masking layer 19, but is preferable to improve the manufacturability of the device. Next, a silicon nitride layer 20 is formed on the surface of the device including dielectric layer 14, the exposed surface of semiconductor material 10, gate layer 18, and hard masking layer 19. Then, an insulating layer 22 comprised of aluminum is formed over insulating layer 20 and a dielectric layer 24 is formed over insulating layer 22.

Layers 20, 22, and 24 are formed as disclosed above like layers 12, 13, and 14. Dielectric layer 24 and insulating layer 22 are etched as disclosed above to form sidewall spacers. Sidewall spacers are formed on every vertical sidewall of the device, however, it has not been illustrated on the sidewall of layers 12, 13, and 14 for illustrative convenience.

Figure 3:
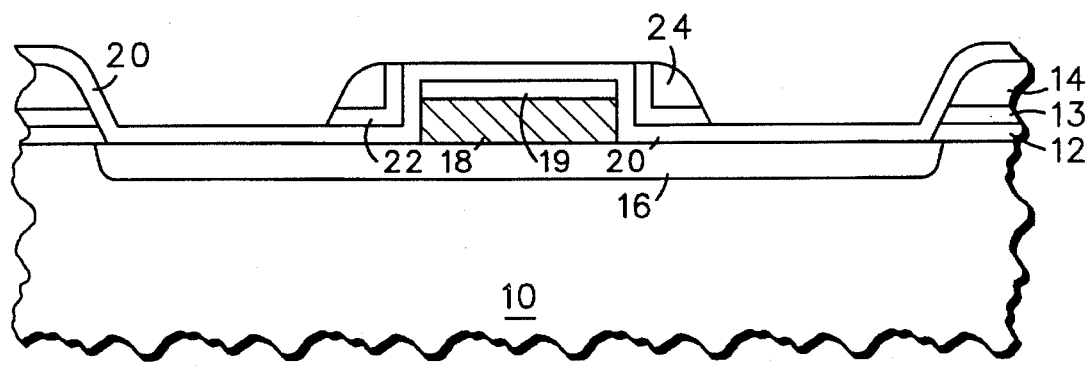
FIG. 3 illustrates the embodiment of the present invention in a further stage of fabrication.
Figure 4:
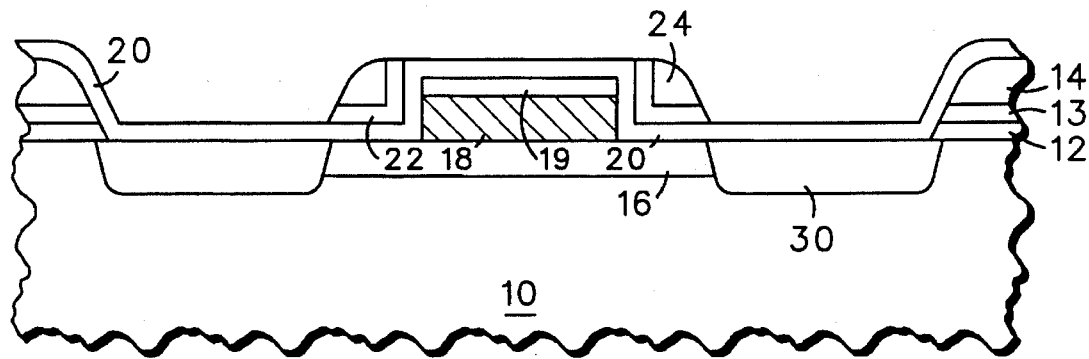
FIG. 4 illustrates the embodiment of the present invention in a further stage of fabrication.

FIG. 4 illustrates the structure of FIG. 3 further along in processing. Source and drain regions 30 are formed in a portion of semiconductor material 10 overlapping the channel region 16. The formation of source and drain regions 30 is conventional and can be accomplished by ion implantation or other techniques.

Figure 5:
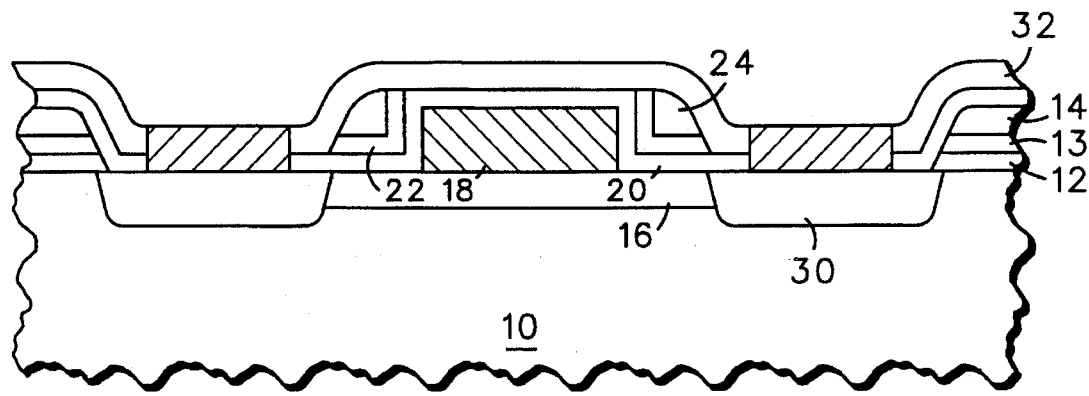
FIG. 5 illustrates the embodiment of the present invention in a further stage of fabrication.
Figure 6:
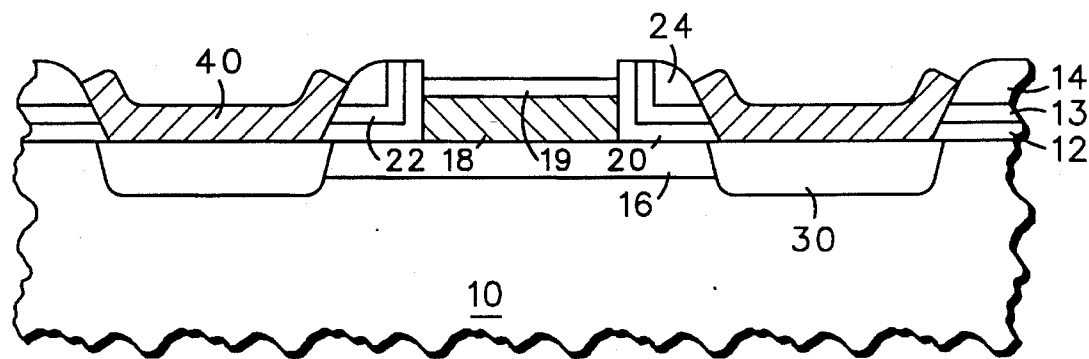
FIG. 6 illustrates the embodiment of the present invention in a later stage of fabrication.

FIG. 5 illustrates the structure of FIG. 4 further along in processing. A silicon dioxide layer 32 is formed over the surface of the entire structure. A portion of silicon dioxide layer 32 may then be removed by a wet etch process using buffered hydrofluoric acid. Subsequently, a portion of silicon nitride layer 20 over source and drain regions 30 is removed by using the etching processes disclosed above to etch silicon nitride layer 12. An ohmic metal layer 40 is deposited and a lift-off technique is used to form electrical contact to source and drain regions 30. Ohmic metal 40 can be comprised of, for example, gold-germanium-nickel (AuGeNi), nickel-germanium-tungsten nitride (NiGeWN) or nickel-germanium-tungsten (NiGeW). In this embodiment, hard masking layer 19 is not needed. Alternatively, ohmic metal layer 40 may be formed by removing the exposed portions of silicon nitride layer 20, depositing ohmic metal layer 40 and etching to pattern ohmic metal layer 40 over source and drain regions 30 as illustrated in FIG. 6. In this embodiment, hard masking layer 19 is preferably used to prevent possible physical contact of ohmic metal layer 40 and gate layer 18 due to misalignment tolerances.

What is claimed is:

1. A method of making a III–V semiconductor structure, comprising the steps of:
    providing a III–V semiconductor material having a major surface;
    forming a first silicon nitride layer over the major surface of the III–V semiconductor material;
    forming a first dielectric layer comprised of aluminum over the silicon nitride layer;
    forming a second dielectric layer comprised of silicon and oxygen over the first dielectric layer; and
    removing a portion of the second dielectric layer and a portion of the first dielectric layer over an active area of the III-V semiconductor material.

2. The method of claim 1 wherein the step of forming the first silicon nitride layer comprises forming the first silicon nitride layer substantially free of moisture and hydrogen.

3. The method of claim 1 wherein the step of removing the portion of the second dielectric layer comprises removing the portion of the second dielectric layer using a fluorine based reactive ion etch.

4. The method of claim 1 wherein the step of removing the portion of the first dielectric layer comprises removing the portion of the first dielectric layer using an ammonium hydroxide solution.

5. The method of claim 1 wherein the step of removing the portion of the first dielectric layer comprised removing the portion of the first dielectric layer using an ammonium hydroxide solution in an approximate ratio of $NH_4OH:H_2O$ (1:10) and used at a temperature of approximately 20° to 40° C.

6. The method of claim 1 wherein the step of removing the portion of the first dielectric layer comprised removing the portion of the first dielectric layer prior to exposing the first dielectric layer to a temperature above approximately 500° C.

7. The method of claim 1 further comprising the steps of:
   forming a channel region in the active area of the III–V semiconductor material;
   removing the first silicon nitride layer;
   forming a gate layer on a portion of the III–V semiconductor material in the active area;
   forming a second silicon nitride layer over the semiconductor material, the gate layer and the second dielectric layer;
   forming a third dielectric layer comprised of aluminum over the second silicon nitride layer;
   forming a fourth dielectric layer comprised of silicon and oxygen over the third dielectric layer;
   removing a portion of the fourth dielectric layer and a portion of the third dielectric layer to at least form a sidewall spacer adjacent the gate layer;
   forming a source and a drain region in the III–V semiconductor material; and
   removing a portion of the second silicon nitride layer.

8. A method of making a III–V semiconductor structure, comprising the steps of:
   providing a III–V semiconductor material having a major surface;
   forming a first silicon nitride layer over the major surface of the III–V semiconductor material, wherein the first silicon nitride layer is substantially free of moisture and hydrogen;
   forming a first dielectric layer comprised of aluminum nitride over the first silicon nitride layer;
   forming a second dielectric layer comprised of silicon and oxygen over the first dielectric layer; and
   removing a portion of the second dielectric layer and a portion of the first dielectric layer over an active area of the III–V semiconductor material.

9. The method of claim 8 wherein the step of removing the portion of the second dielectric layer comprises removing the portion of the second dielectric layer using a fluorine based reactive ion etch.

10. The method of claim 8 wherein the step of removing the portion of the first dielectric layer comprises removing the portion of the first dielectric layer using an ammonium hydroxide solution.

11. The method of claim 8 wherein the step of removing the portion of the first dielectric layer comprised removing the portion of the first dielectric layer using an ammonium hydroxide solution in an approximate ratio of $NH_4OH:H_2O$ (1:10) and used at a temperature of approximately 20° to 40° C.

12. The method of claim 8 wherein the step of removing the portion of the first dielectric layer comprised removing the portion of the first dielectric layer prior to exposing the first dielectric layer to a temperature above approximately 500° C.

13. The method of claim 8 further comprising the steps of:
   forming a channel region in the active area of the III–V semiconductor material;
   removing the first silicon nitride layer;
   forming a gate layer on a portion of the III–V semiconductor material in the active area;
   forming a second silicon nitride layer over the semiconductor material, the gate layer and the second dielectric layer, wherein the second silicon nitride layer is substantially free of moisture;
   forming a third dielectric layer comprised of aluminum nitride over the second silicon nitride layer;
   forming a fourth dielectric layer comprised of silicon and oxygen over the third dielectric layer;
   removing a portion of the fourth dielectric layer and a portion of the third dielectric layer to at least form a sidewall spacer adjacent the gate layer;
   forming a source and a drain region in the III–V semiconductor material; and
   removing a portion of the second silicon nitride layer.

* * * * *